(12) United States Patent  
Borlenghi et al.

(10) Patent No.: US 11,658,771 B2  
(45) Date of Patent: May 23, 2023

(54) ERROR-TOLERANT FORWARD ERROR CORRECTION ORDERED SET MESSAGE DECODER

(71) Applicant: Kandou Labs SA, Lausanne (CH)

(72) Inventors: Filippo Borlenghi, Borex (CH); David Stauffer, Essex Junction, VT (US)

(73) Assignee: KANDOU LABS SA, Lausanne (CH)

( * ) Notice: Subject to any disclaimer, the term of this patent is extended or adjusted under 35 U.S.C. 154(b) by 0 days.

(21) Appl. No.: 17/834,628

(22) Filed: Jun. 7, 2022

(65) Prior Publication Data

US 2022/0303049 A1    Sep. 22, 2022

Related U.S. Application Data

(63) Continuation of application No. 17/207,565, filed on Mar. 19, 2021, now Pat. No. 11,356,197.

(51) Int. Cl.
*H04L 1/00* (2006.01)
*G06F 13/42* (2006.01)

(52) U.S. Cl.
CPC .......... *H04L 1/0045* (2013.01); *H04L 1/0061* (2013.01); *G06F 13/4282* (2013.01); *G06F 2213/0042* (2013.01)

(58) Field of Classification Search
CPC .... H04L 1/0041; H04L 1/0045; H04L 1/0061
See application file for complete search history.

(56) References Cited

U.S. PATENT DOCUMENTS

| | | |
|---|---|---|
| 3,629,824 A | 12/1971 | Bossen |
| 3,965,418 A | 6/1976 | Bauer et al. |
| 4,112,264 A | 9/1978 | Abramson et al. |
| 4,486,739 A | 12/1984 | Franaszek et al. |
| 4,772,845 A | 9/1988 | Scott |
| 4,864,303 A | 9/1989 | Ofek |
| 5,168,509 A | 12/1992 | Nakamura et al. |
| 5,566,193 A | 10/1996 | Cloonan |
| 5,825,808 A | 10/1998 | Hershey et al. |
| 5,875,202 A | 2/1999 | Venters et al. |

(Continued)

FOREIGN PATENT DOCUMENTS

| | | |
|---|---|---|
| CN | 1671092 A | 9/2005 |
| CN | 101820288 B | 1/2013 |

(Continued)

OTHER PUBLICATIONS

International Search Report and Written Opinion for PCT/US2022/021179, dated Jul. 6, 2022, 1-11 (11 pages).

(Continued)

*Primary Examiner* — Shelly A Chase
(74) *Attorney, Agent, or Firm* — Invention Mine LLC (57) ABSTRACT

Methods are described for identifying and acting upon predetermined message patterns during reception of a data stream structured as USB message frames. A first embodiment performs pattern matching between received message bits and one or more predetermined sequences, identifying unscrambled ordered set messages. A second embodiment applies a descrambling operation and performs comparable pattern matching between descrambled received message bits and one or more additional predetermined sequences, identifying scrambled ordered set messages.

20 Claims, 5 Drawing Sheets

(56) References Cited

U.S. PATENT DOCUMENTS

| | | | |
|---|---|---|---|
| 5,881,130 A | 3/1999 | Zhang | |
| 6,097,732 A | 8/2000 | Jung | |
| 6,119,263 A | 9/2000 | Mowbray et al. | |
| 6,128,330 A | 10/2000 | Schilling | |
| 6,163,284 A * | 12/2000 | Munakata | H03M 5/12 341/68 |
| 6,175,230 B1 | 1/2001 | Hamblin et al. | |
| 6,188,497 B1 | 2/2001 | Franck et al. | |
| 6,404,820 B1 | 6/2002 | Postol | |
| 6,473,877 B1 | 10/2002 | Sharma | |
| 6,650,638 B1 | 11/2003 | Walker et al. | |
| 6,690,739 B1 | 2/2004 | Mui | |
| 6,865,234 B1 | 3/2005 | Agazzi | |
| 6,963,622 B2 | 11/2005 | Eroz et al. | |
| 6,973,613 B2 | 12/2005 | Cypher | |
| 6,976,194 B2 | 12/2005 | Cypher | |
| 6,982,954 B2 | 1/2006 | Dhong et al. | |
| 7,057,546 B1 | 6/2006 | Secatch et al. | |
| 7,080,288 B2 | 7/2006 | Ferraiolo et al. | |
| 7,082,557 B2 | 7/2006 | Schauer et al. | |
| 7,231,558 B2 | 6/2007 | Gentieu et al. | |
| 7,269,130 B2 | 9/2007 | Pitio | |
| 7,335,976 B2 | 2/2008 | Chen et al. | |
| 7,346,819 B2 | 3/2008 | Bansal et al. | |
| 7,362,130 B2 | 4/2008 | Broyde et al. | |
| 7,362,697 B2 | 4/2008 | Becker et al. | |
| 7,370,264 B2 | 5/2008 | Worley et al. | |
| 7,643,588 B2 | 1/2010 | Visalli et al. | |
| 7,694,204 B2 | 4/2010 | Schmidt et al. | |
| 7,698,088 B2 | 4/2010 | Sul et al. | |
| 7,734,191 B1 | 6/2010 | Welch et al. | |
| 7,882,413 B2 | 2/2011 | Chen et al. | |
| 7,933,770 B2 | 4/2011 | Krueger et al. | |
| 8,091,006 B2 | 1/2012 | Prasad et al. | |
| 8,185,807 B2 | 5/2012 | Oh et al. | |
| 8,209,580 B1 | 6/2012 | Varnica et al. | |
| 8,233,544 B2 | 7/2012 | Bao et al. | |
| 8,245,102 B1 | 8/2012 | Cory et al. | |
| 8,279,094 B2 | 10/2012 | Abbasfar | |
| 8,341,492 B2 | 12/2012 | Shen et al. | |
| 8,365,035 B2 | 1/2013 | Hara | |
| 8,429,492 B2 | 4/2013 | Yoon et al. | |
| 8,429,495 B2 | 4/2013 | Przybylski | |
| 8,462,891 B2 | 6/2013 | Kizer et al. | |
| 8,521,020 B2 | 8/2013 | Welch et al. | |
| 8,539,318 B2 | 9/2013 | Shokrollahi et al. | |
| 8,578,246 B2 | 11/2013 | Mittelholzer et al. | |
| 8,711,919 B2 | 4/2014 | Kumar | |
| 8,773,964 B2 | 7/2014 | Hsueh et al. | |
| 8,949,693 B2 | 2/2015 | Ordentlich et al. | |
| 9,152,495 B2 | 10/2015 | Losh et al. | |
| 9,172,412 B2 | 10/2015 | Kim et al. | |
| 9,183,085 B1 | 11/2015 | Northcott | |
| 9,300,503 B1 | 3/2016 | Holden et al. | |
| 9,444,654 B2 | 9/2016 | Hormati et al. | |
| 9,455,744 B2 | 9/2016 | George et al. | |
| 9,588,715 B2 | 3/2017 | Staelin et al. | |
| 9,608,669 B2 | 3/2017 | Song et al. | |
| 9,667,379 B2 | 5/2017 | Cronie et al. | |
| 9,852,806 B2 | 12/2017 | Stauffer et al. | |
| 10,243,614 B1 | 3/2019 | Ulrich et al. | |
| 10,396,819 B1 | 8/2019 | Myung et al. | |
| 10,601,574 B2 | 3/2020 | Hormati | |
| 10,873,373 B2 | 12/2020 | Suh et al. | |
| 2001/0000219 A1 | 4/2001 | Agazzi et al. | |
| 2002/0154633 A1 | 10/2002 | Shin et al. | |
| 2002/0163881 A1 | 11/2002 | Dhong et al. | |
| 2003/0016770 A1 | 1/2003 | Trans et al. | |
| 2003/0185310 A1 | 10/2003 | Ketchum et al. | |
| 2006/0245757 A1 | 11/2006 | Elahmadi et al. | |
| 2006/0291571 A1 | 12/2006 | Divsalar et al. | |
| 2007/0076871 A1 | 4/2007 | Renes | |
| 2007/0204205 A1 | 8/2007 | Niu et al. | |
| 2007/0283210 A1 | 12/2007 | Prasad et al. | |
| 2008/0016432 A1 | 1/2008 | Lablans | |
| 2009/0110106 A1 | 4/2009 | Wornell et al. | |
| 2009/0141827 A1 | 6/2009 | Saito et al. | |
| 2009/0150754 A1 | 6/2009 | Dohmen et al. | |
| 2009/0316730 A1 | 12/2009 | Feng et al. | |
| 2010/0146363 A1 | 6/2010 | Birru et al. | |
| 2010/0287438 A1 | 11/2010 | Lakkis | |
| 2011/0051854 A1 | 3/2011 | Kizer et al. | |
| 2011/0072330 A1 | 3/2011 | Kolze | |
| 2011/0299555 A1 | 12/2011 | Cronie et al. | |
| 2012/0036415 A1 | 2/2012 | Shafrir et al. | |
| 2012/0272117 A1 | 10/2012 | Stadelmeier et al. | |
| 2013/0223552 A1 * | 8/2013 | Okada | H03M 9/00 375/267 |
| 2013/0259113 A1 | 10/2013 | Kumar | |
| 2013/0315264 A1 | 11/2013 | Srinivasa et al. | |
| 2013/0315501 A1 | 11/2013 | Atanassov et al. | |
| 2013/0346830 A1 | 12/2013 | Ordentlich et al. | |
| 2014/0068385 A1 | 3/2014 | Zhang et al. | |
| 2014/0068391 A1 | 3/2014 | Goel et al. | |
| 2014/0079394 A1 | 3/2014 | Xie et al. | |
| 2015/0070201 A1 | 3/2015 | Dedic et al. | |
| 2015/0092532 A1 | 4/2015 | Shokrollahi et al. | |
| 2015/0381315 A1 | 12/2015 | Thomson et al. | |
| 2016/0020796 A1 | 1/2016 | Hormati et al. | |
| 2016/0134267 A1 | 5/2016 | Adachi | |
| 2016/0380787 A1 | 12/2016 | Hormati et al. | |
| 2017/0017604 A1 * | 1/2017 | Chen | G06F 11/3027 |
| 2017/0317855 A1 | 11/2017 | Shokrollahi et al. | |
| 2019/0095380 A1 | 3/2019 | Das Sharma | |
| 2020/0145341 A1 | 5/2020 | Das Sharma | |
| 2020/0313841 A1 | 10/2020 | Ulrich et al. | |

FOREIGN PATENT DOCUMENTS

| | | |
|---|---|---|
| EP | 1926267 A1 | 5/2008 |
| WO | 2005002162 A1 | 1/2005 |

OTHER PUBLICATIONS

Belogolovy, A., et al., "Forward Error Correction for 10GBASE-KR PHY", IEEE 802.3ap-00/0000r4, Nov. 2005, 1-13 (13 pagges).

Ben-Neticha, Zouhair, et al., "The "Stretched"-Golay and Other Codes for High-SNR Finite-Delay Quantization of the Gaussian Source at ½ Bit Per Sample", IEEE Transactions on Communications, New York, US, vol. 38, No. 12, XP000203339, Dec. 1990, 2089-2093 (5 pages).

Burr, A.G., "Spherical Codes for M-ARY Code Shift Keying", Second IEE National Conference on Telecommunications, University of York, UK, Apr. 2, 1989, 67-72 (6 pages).

Ericson, Thomas, et al., "Spherical Codes Generated by Binary Partitions of Symmetric Pointsets", IEEE Transactions on Information Theory, vol. 41, No. 1, Jan. 1995, 107-129 (23 pages).

* cited by examiner

ERROR-TOLERANT FORWARD ERROR CORRECTION ORDERED SET MESSAGE DECODER

CROSS-REFERENCE TO RELATED APPLICATIONS

This application is a continuation of U.S. application Ser. No. 17/207,565, filed Mar. 19, 2021, entitled "Error-Tolerant Forward Error Correction Ordered Set Message Decoder", which is hereby incorporated herein by reference in its entirety for all purposes.

BACKGROUND

Generally, a data communications system is defined by its architectural model, the protocols that instantiate each layer of that model, and then by the physical embodiments of those protocol layers. Thus, it is typical to say, "this system implements layers 1 through 7 of the OSI network model, incorporating a custom application program communicating over TCP/IP, with a MAC/PHY later optimized for transmission over printed circuit traces." However, in practical systems, the details of the lower-level transport, e.g. the wires and the physical signals they carry, may significantly impact the overall performance and capabilities of the system. Thus, a substantial technological corpus has developed to facilitate operation of the PHY or physical level transport on which the network depends.

As examples, optimized line drivers and line receivers may be used to initiate and detect wire transmissions, and in long wire paths intermediary amplifiers may be introduced to mitigate the effects of wire attenuation by restoring the original signal amplitude.

However, if the physical medium (wire or optical fiber) has any dispersive characteristic, the amplitude of signal transitions will not only be attenuated but the rise and fall times of those transitions will also be affected, generally described as a spreading or softening of pulse edges that a receiver may interpret as timing variations. Thus, intermediary devices such as "retimers" both amplify and reclock the signal being regenerated, in an attempt to reconstitute not only the original signal amplitude, but also its pulse edge timing characteristics.

The PHY/MAC layers of the network may impose additional constraints, typically having to do with identification of the start and end of a message block or "packet", and optionally including an interactive procedure that arbitrates access to a shared communications medium. A "repeater" is generally considered to be an amplifier and pulse regenerator/retimer also having awareness of and participating in those media access behaviors.

Even though intermediate devices such as retimers and repeaters may operate by passing along individual bits without regard to higher-level protocol behavior, they themselves may need to receive and respond to said protocol messages, as part of its general compliance with management, configuration, or other operational system requirements.

BRIEF DESCRIPTION

In some USB support devices, it may be problematic to provide sufficient internal memory and/or processing power to fully buffer an entire USB message frame. Such buffering is generally considered necessary, as a conventional implementation relies on the state of sync bits received near the end of the message to facilitate parsing message segments (super symbols) earlier in the message.

In an alternative embodiment, a pattern matching operation is used to identify particular USB messages incrementally during data reception, with the eventual reception of sync bits and/or error correction checksum used to confirm the identified message patterns. The amount of local memory used to buffer, compare, and flag identified pattern matches is significantly less than required to buffer an entire frame. In a further embodiment, the need to perform a full forward error correction computation in the event of a detected error may be avoided, further reducing the necessary computational capabilities required.

DETAILED DESCRIPTION

The Universal Serial Bus (USB) specification has evolved significantly since its inception in 1996. Originally a mechanism for host-to-peripheral device attachment, it has grown to support far more elaborate use cases, ranging from high speed peer-to-peer connection to raw power delivery. Advanced versions of the USB specification have also incorporated other protocol standards, one significant example being Apple's Thunderbolt.

The evolutionary nature of the USB specification, along with the need for each advancement to provide backwards compatibility with earlier versions, have resulted in a layering of multiple data encoding and data integrity functions onto the basic data stream, with a corresponding number of special cases to be handled.

The USB 4 specification describes channels carrying a 10 or 20 Gigabit/second data stream. To facilitate receive clock recovery, the transmitted stream is scrambled using a conventional cyclic sequence generator (typically referred to as a pseudo-random number generator, or a PRNG) initialized at link startup, with data integrity maintained by a forward-error-correction (FEC) code capable of correcting up to two byte errors per message block and detecting larger errors.

As USB receivers often use decision feedback equalization (DFE) to counteract the effects of inter-symbol interference, a single received bit error is likely to result in a block or "burst" of incorrectly decoded bits, as feedback of the incorrect data value through the DFE computation will steer sampling thresholds away from correct levels until the stream of errors finally is flushed from the DFE history. To mitigate this effect, advanced versions of the USB 4 standard specify a pre-coding operation that performs a bitwise integration operation on the transmit data stream, and a complementary differentiation operation on the received data stream. This pre-coding has the effect of converting a block data error into two single-bit errors, one at the start and one at the end of the block. As this is within the correction capability of the FEC code, the result is significantly improved data integrity.

Figure 4:
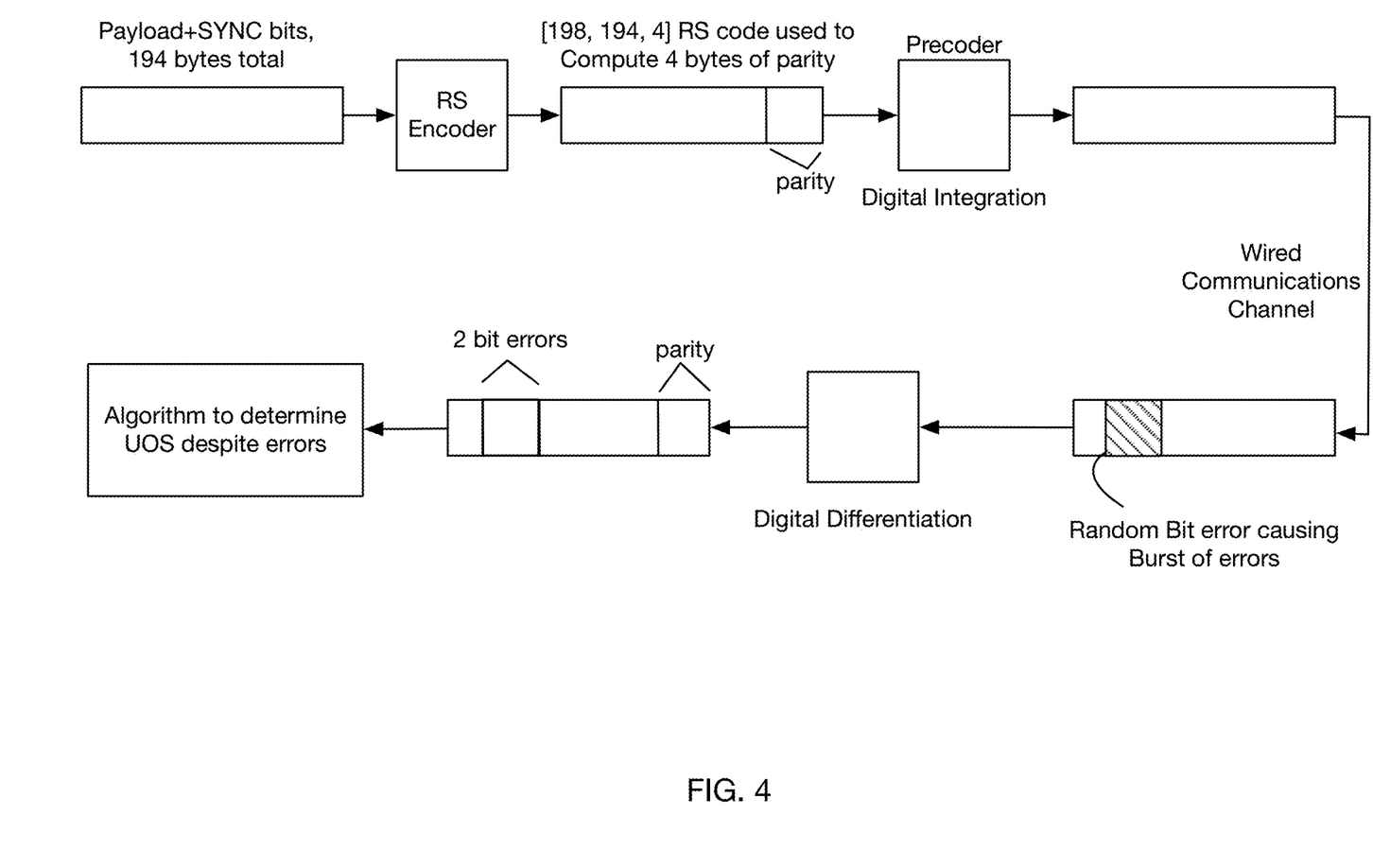
FIG. 4 is a flow diagram of a frame of data being transmitted over a wired communications channel, in accordance with some embodiments.

FIG. 4 illustrates a flow diagram of a super symbol being transmitted over a wired communications channel, which may be e.g., one or more wires of a multi-wire bus, in accordance with some embodiments. As shown in FIG. 4, a 194-byte frame including payload data and sync bits is encoded using e.g., a Reed-Solomon encoding scheme to compute e.g., 4 bytes of parity, which are added on to the original 194-byte frame. The FEC encoded frame is digitally integrated using a precoder as described above, and transmitted over the wired communications channel, during which a bit error might occur causing a burst of errors in the transmitted frame. Through digital differentiation at the decoder, the burst of errors is converted into two single bit errors as described above, after which an algorithm identifies unscrambled ordered sets (UOS) and scrambled ordered sets (SOS) by comparing the received super symbols in the frame to known ordered set values, as described in more detail below.

Figure 1:
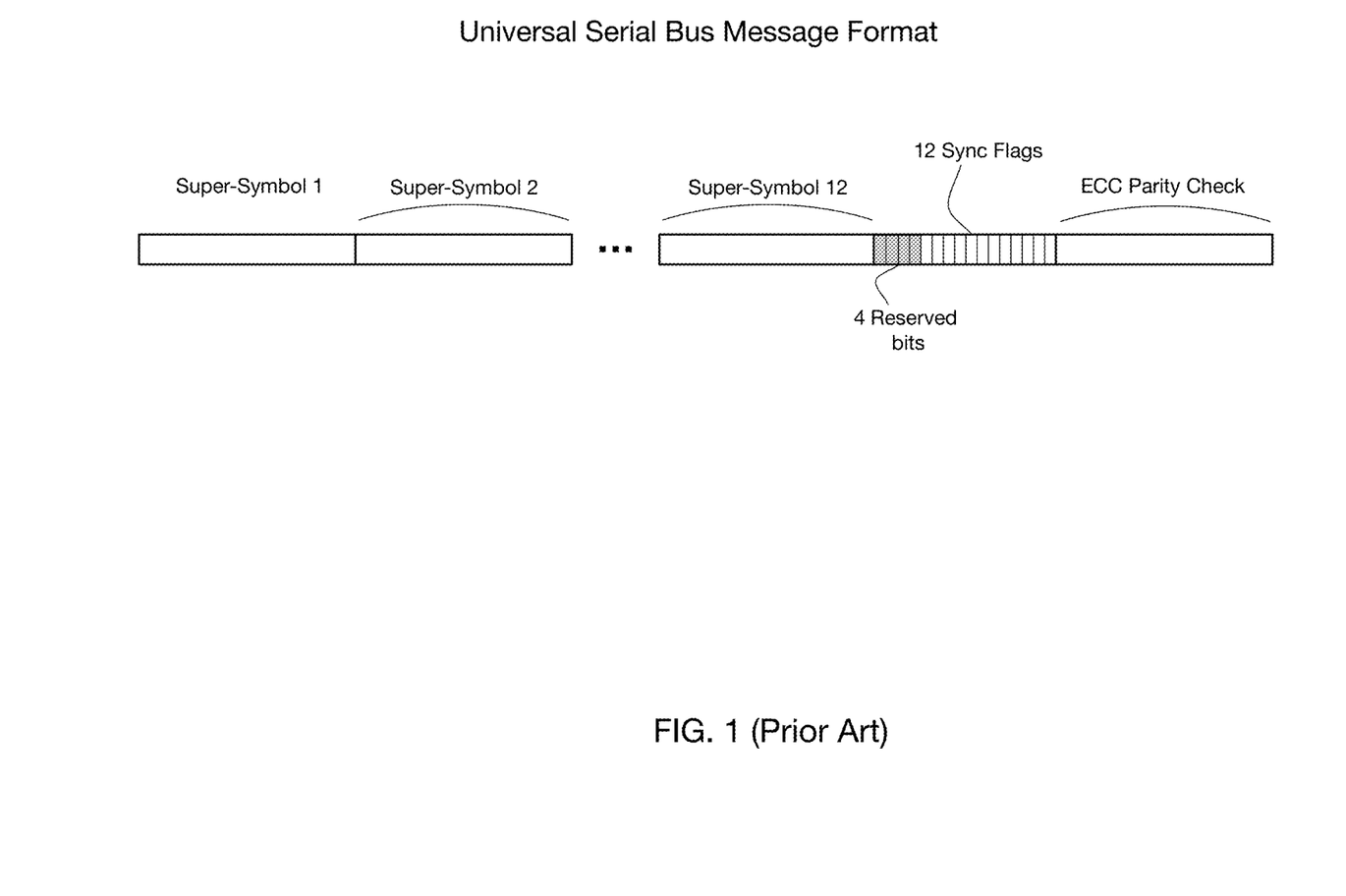
FIG. 1 is an illustration showing the standardized format of a Universal Serial Bus message.

The protocol format for a USB 4 frame is shown in FIG. 1. The frame payload includes 192 bytes followed by a two-byte "Sync" control field and a four-byte FEC parity word. The payload is divided into twelve sixteen-byte "super symbols", each super symbol being one of:
1. An unscrambled ordered set (UOS). These contain specific control messages transmitted without data scrambling, and having particular low-level protocol control behaviors.
2. A scrambled ordered set (SOS). These are also low-level protocol control messages, but are transmitted using the usual data scrambling process.
3. Scrambled data—unconstrained user data, transmitted using the usual data scrambling process The two-byte sync field includes four reserved bits and 12 flag bits, each flag bit corresponding to one super symbol of the current frame. A flag set to '1' may indicate that a super symbol in a corresponding index or location of the data frame contains a scrambled or an unscrambled ordered set.

In previous USB protocol versions, each super symbol contained 8 bytes or 64 bits. For compatibility between those legacy versions and the larger 128 byte super symbols of the most recent specification version, two copies of the same 64 bit UOS control message are always transmitted together in USB 4, thus introducing a 128 bit gap or pause in the normal progression of the scrambler. In current USB implementations, the UOS control messages SKIP and TSNOS will periodically be interleaved with scrambled data messages. The UOS control message CL_WAKE2 may also be received at CLOs exit.

A conventional (i.e. prior art) software-oriented parsing of the resulting frame would proceed as:
Receive 192+2+4 bytes into a message buffer
Compute the ECC parity across the entire message. As is well understood in the art, this may entail re-computing the parity as transmitted across the first 194 bytes of the message and comparing the computed result and the 4 byte received FEC parity word. Alternatively, it is known that the same calculation may be configured such that computing the parity over the entire 198 byte message including the received FEC parity word produces a zero result if no error was found. For convenience, the latter computation mode will be assumed without implying limitation.
If errors were found, perform the FEC error recovery procedure to identify the message byte(s) containing errors, and the bits to be corrected in those bytes. (If uncorrectable errors remain, exit this message parsing procedure and initiate whatever resynchronization/recovery procedures are defined for error correction failure.)
For each super symbol in the message, determine if it is scrambled or unscrambled. The sync flags identify super symbols containing ordered sets.
4. If scrambled (ordered set or data), unscramble the super symbol contents using the scrambler pseudo-random generator. As known in the art, the scrambler contents must be advanced after each use, e.g. advancing the pseudo-random scrambling sequence generator by one count for each bit descrambled. Scrambled ordered sets, such as those corresponding to command messages, may be detected and acted upon using conventional message parsing or pattern matching after having been descrambled.
5. If unscrambled, the as-received (or, as-FEC corrected) data may be parsed or pattern-matched directly. The scrambler contents are not advanced.

This procedure is straightforward for a typical host computer system or a client device with moderate memory and processing capabilities. However, several aspects of it are intractable or awkward for a low-level embedded device such as a repeater or retimer. First, sufficient memory is needed to store an entire frame, whereas an embedded hardware device may be limited to buffering or storage of no more than tens of bytes. Second, if the FEC parity check indicates an error, the full FEC recovery process must be run to identify where in the frame the error occurs, such computation requiring significant memory and processing capabilities. In the worst case, the sync bits may be in error, which would lead to an inability to identify unscrambled ordered set super symbols, thus leading to a failure to maintain the scrambler synchronization needed to parse subsequent messages.

In contrast, the embodiment described herein may parse super symbols in the received data frame "on the fly", i.e. as they are received, and process the super symbols as they are received as opposed to buffering the entire frame. In some embodiments, this parsing includes pattern matching of the as-received data to known SOS and UOS messages to identify potential SOS and UOS candidates, which in turn allows dynamic decision making as to whether the descrambler should be advanced or halted as appropriate for the type of super symbol detected, and furthermore direct other elements of the chip to take various other actions such as enter a low-power mode responsive to identifying certain SOS.

In practice, there are only a limited number of possible UOS messages to be identified (in some embodiments, as few as two or three) thus a finite state machine may be used to perform the pattern matching operations. Without implying limitation, the following descriptions assume that the comparison or matching operation occurs for each eight bits (i.e. byte) received, each operation successively comparing eight received bits against corresponding portions of one or more known values representing known UOS message patterns that may be stored in e.g., memory or some other storage circuit. In one such embodiment, an explicit "XOR" comparison is made of the received data byte and a byte of each possible message; in another embodiment, the comparison incorporates "don't care" elements that force a match for those elements regardless of value, allowing two or more messages differing only in a few bit locations to be detected by the same comparison operations. Similarly, known message patterns not extending over the entire 128 (or, for earlier protocol versions, 64) bits of a super symbol may judiciously apply said "don't care" elements to skip the redundant or inapplicable portions of the message.

Figure 2:
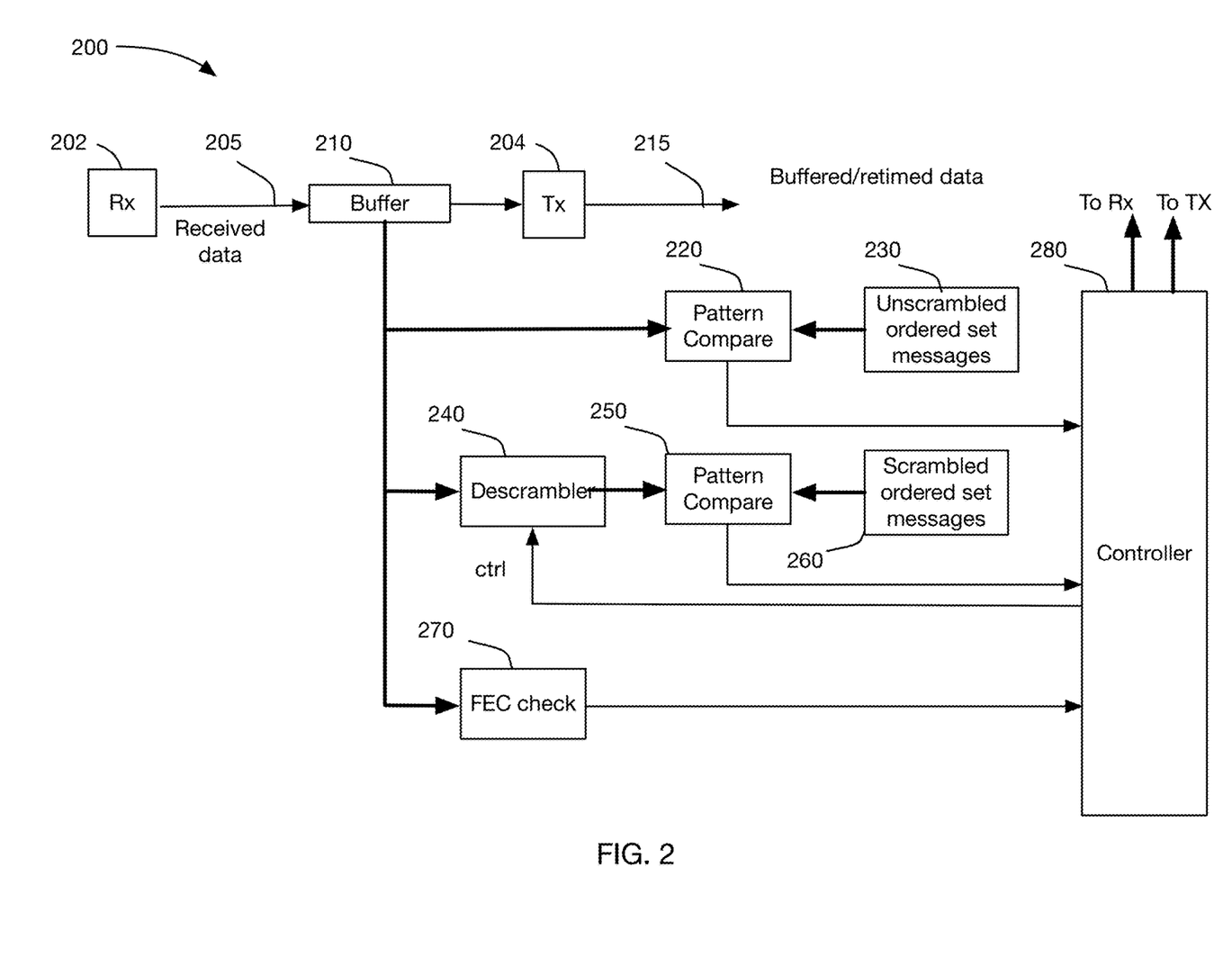
FIG. 2 illustrates the parsing of a received Universal Serial Bus message by one embodiment in accordance with the invention.

FIG. 2 is a block diagram of a retimer chip 200, in which a received data frame 205 is processed by a receiver 202 buffered 210 prior to being retransmitted by transmitter 204 as a retimed data frame 215. In a repeater/retimer embodiment, buffer 210 may be a first-in, first-out (FIFO) register, typically buffering as few as eight, but potentially as many as several hundred bits. As increments of the incoming message accumulate in the buffer, pattern matches 220 and 250 are made against known UOS and SOS messages, respectively, for which an action is desired. While FIG. 2 illustrates Rx 202 and Tx 204 elements operating in a singular direction of dataflow, it should be noted that many embodiments incorporate a bidirectional flow of data and include equivalent Rx and Tx devices to operate in an opposite direction of dataflow, as described in more detail below with regards to FIG. 5.

As shown in FIG. 2, an apparatus 200 includes a buffer 210 configured to buffer a received data frame processed by receiver 202 including a set of super symbols, a set of sync bits and a received forward error correction (FEC) parity word. The apparatus further includes e.g., transmit drivers within transmitter 204 to output retimed data 215. The apparatus further includes a pattern compare circuit 220 configured to identify an unscrambled ordered set (UOS) candidate in the set of super symbols by comparing portions of each super symbol to corresponding portions of one or more known UOS values, which may be stored e.g., in a storage circuit 230. The apparatus further includes a FEC check circuit 270 configured to calculate a local FEC parity word based on the received data frame. Such a calculation may be performed incrementally from data upon reception. The apparatus further includes a controller 280, which may be configured to provide a control signal 'ctrl' to descrambler 240 to halt advancement of the descrambler operation during the identified UOS candidate responsive to the identification of the UOS candidate. Furthermore, the control signal 'ctrl' may additionally re-advance the descrambler 240 responsive to identifying that the UOS candidate is a false UOS candidate by validating the UOS candidate against a corresponding sync bit responsive to a comparison of the local FEC parity word to the received FEC parity word. In some embodiments, the control signal 'ctrl' advances the descrambling operation by a predetermined amount (e.g., number of bytes). Alternatively, the controller may maintain a syndrome value of the descrambler at the beginning of each super symbol or data frame and may restore the state of the descrambler using the stored syndrome value. Thus, the descrambler 240 may be configured to descramble scrambled super symbols received in a subsequent data frame to identify scrambled ordered sets by comparing them e.g., against a second pattern compare circuit against the known scrambled ordered set messages 260 that may be stored in a similar storage device as 230.

One embodiment buffers and compares incoming data in 8 bit (e.g. byte) increments, and compares using pattern compare circuit 220 each received byte to corresponding byte locations of one or more known UOS stored in storage circuit 230. If the raw (e.g. not unscrambled) contents of the received data stream match one of those detectable message patterns of a given known UOS, a "match counter" maintained e.g., by controller 280 is incremented associated with that message pattern.

If at least six bytes match in a given 64 bit received sequence, the matched sequence is identified as an unscrambled ordered set candidate (UOS candidate.) In a further embodiment, said matching operations are continued across an entire 128 bit super symbol (rather than only the 64 bits of a legacy message length), with a match count of at least 14 bytes out of the potential 16 bytes being considered as a UOS candidate. As the protocol's FEC capabilities allow correction of up to two byte errors per frame, this "6 or more out of 8" or "14 or more out of 16" byte match procedure will detect an incoming message of the desired format, even in the presence of two separate byte errors, e.g. one or more bit errors occurring in each of two different received message bytes. The likelihood of false identification of one of the limited set of detectable UOS messages due to such partial matching is exceedingly small, and in the worst case would result in the need to resynchronize the descrambler before the embedded device can receive a subsequent scrambled message. Statistically, the probability of false identification is estimated as:

$$p = \frac{2 \times \sum_{e=0}^{2} \binom{16}{e} 255^e}{2^{128}} \quad \text{(eqn. 1)}$$

which is on the order of $4.6 \times 10^{-32}$

In some embodiments, this bit- or byte-wise comparison of buffered super symbols to known UOS messages for identifying UOS candidates may overlap in time or occur essentially in parallel with a similar comparison process identifying known SOS messages. This latter operation includes incrementally descrambling 240 received message data (thus advancing the state of the scrambler by some number of bit intervals) and then performing a pattern comparison operation using a pattern compare circuit 250 that may be similar to that of pattern compare circuit 220 as described above against known SOS message patterns 260. It is possible that by the time that an UOS candidate is identified, the descrambler operating to identify concurrent SOS message comparison operation may have incorrectly advanced by some number of bit times. This would cause the receiver's descrambler state to lose synchronization with the transmitter's scrambler state, impeding further scrambled data reception.

Some embodiments may restore descrambler synchronization by halting advancement of the descrambling operation of descrambler 240 for a predetermined number of bit intervals, e.g. 128 bit intervals for the most recent frame format or 64 bit intervals for older versions, responsive to identifying a UOS candidate by the pattern matching function. Alternative embodiments may remember the value of the scrambler syndrome at the beginning of a super symbol, and then may restore that state to a descrambler that has been clocked or advanced unnecessarily upon detection of a false UOS candidate.

The receive FEC parity check 270 may also be calculated dynamically as the message is received and, if no errors are found and the previously-identified message pattern matches confirmed by the sync bit flags, the actions identified through pattern matching may be acted upon. In some embodiments, said actions may include suspending advancement of the scrambler state for the duration of a super symbol, and executing the USB command associated with the identified UOS message. It should be noted that in some embodiments FEC parity check 270 may compare the locally generated FEC parity word to the received FEC parity word and notify controller 280 of whether or not errors occurred.

It should be reiterated that the FEC parity check 270 is computed over the as-received data bits, thus its computation and verification are independent of the synchronization state of the scrambler, or whether the descrambler 240 is being advanced or halted.

If the number of set sync flag bits does not match the number of UOS super symbols identified by pattern matching, it is possible that a false UOS candidate was identified, thus unnecessarily suspending advancement of the descrambler state. Alternatively, it is possible that one or more of the sync flag bits were received in error.

In one embodiment, if the receive FEC parity check identifies the presence of errors, the pattern matching results are given precedence over the values of the sync flag bits, in both determining the state of the descrambler 240, and in executing the USB commands identified by identifying true UOS and SOS messages. Statistically, the probability of a received sync flag bit error is significantly greater than the probability of a false pattern match as performed by the described embodiment. Although this probability computation assumes the synergistic benefits of pre-coding constraining the creation of blocks of data errors with the two-byte correction offered by FEC, the described message parsing remains functional in the absence of one or both of those protocol functions.

In a further embodiment, if the receive FEC parity check verifies that no errors occurred in a received frame and the number of UOS candidates determined by pattern matching does not correspond with the number of sync flag bits set in that frame, it may be determined that one or more false UOS candidates were detected, and precedence given to the set sync flags over the pattern matching results, suggesting that the scrambler state may have been unnecessarily frozen during on-the-fly UOS pattern matching. Furthermore, the position of the UOS candidates in the received data frame may be checked against the position of the sync bits to determine if a UOS candidate is a true or false UOS candidate. In such an event, the scrambler state may subsequently be re-advanced by the number of bit intervals (64 or 128 per super symbol, depending on the protocol version in use) in the event that the sync bits indicate a false UOS candidate was identified.

As the synchronization of descrambler 240 is maintained at the start of each received frame of symbols, SOS pattern compare 250 may accurately identify various SOS and notify controller 280 to take specific actions within the retimer chip 200 itself. As described above, the retimer chip 200 of FIG. 2 includes transceiver circuits having transmitters 204 and receivers 202. The transmitters 204 may include components such as transmit drivers and the receivers 202 may include components such as phase-lock loops (PLLs) and clock-data recovery (CDR) circuits. In some embodiments, the SOS messages identified by SOS pattern compare 250 may include various low-power commands such CL_req (request low power), CL_ack (acknowledge and initiation of low power request in first data flow direction), and CL_off (initiation of low power in second data flow direction). Responsive to identification of such SOS messages, controller 280 may provide control signals to the Rx 202 and Tx 204 elements to power down various circuit elements to save power. In one non-limiting example, the transmit drivers may be turned off in the Tx 204 and the CDR circuit may be turned off in the Rx 202. Furthermore, controller may include an analog filter to identify a low-frequency power-up signal to enter a high-speed data (i.e., normal) mode of operation.

Figure 5:
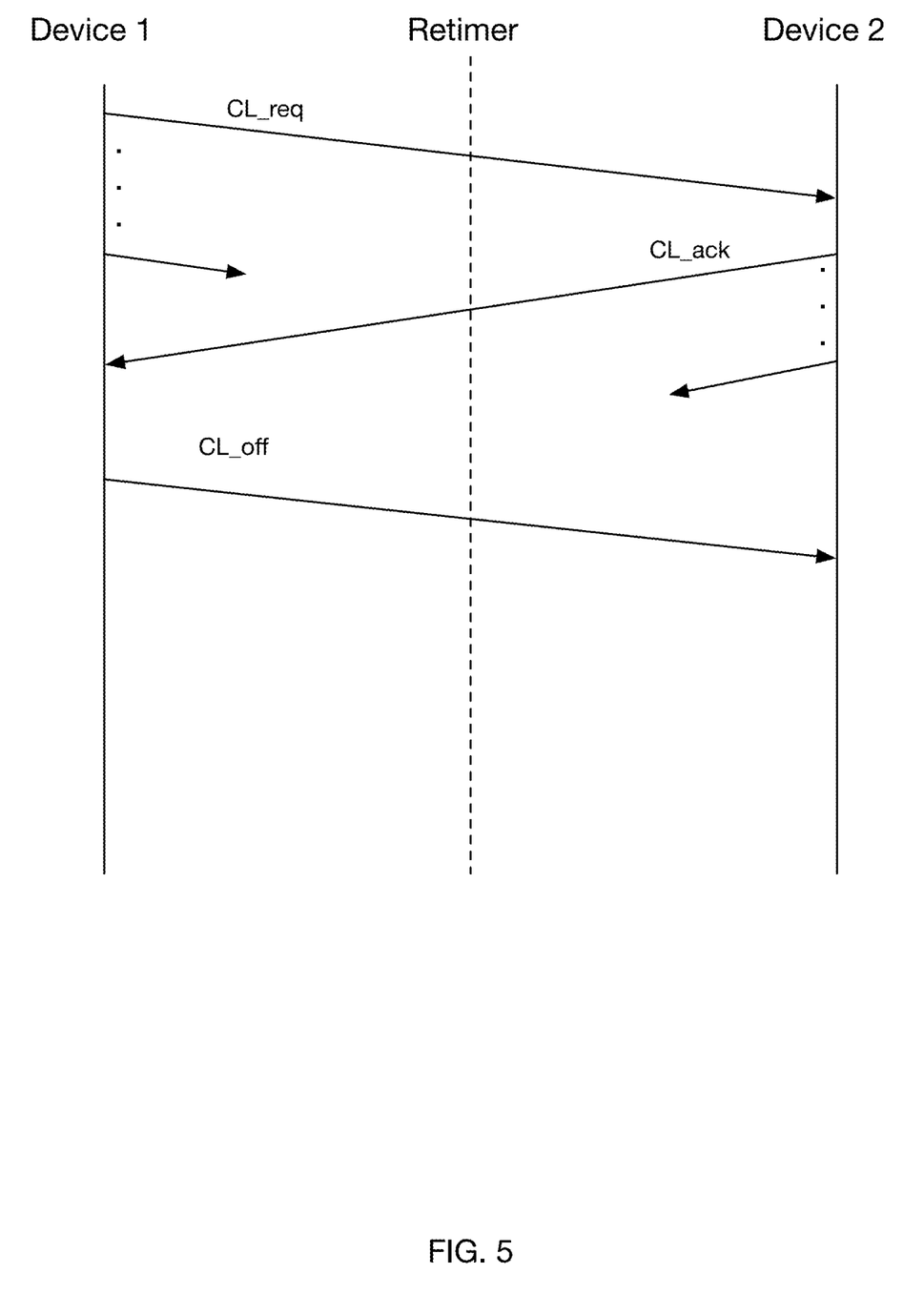
FIG. 5 is a flowchart of a low-power initiation handshake protocol, in accordance with some embodiments.

FIG. 5 illustrates operation of a low-power handshake protocol, in accordance with some embodiments. As shown, FIG. 5 includes bidirectional data flow between devices 1 and 2 with a retimer (such as that of FIG. 2) in between them configured to process incoming data from each device and output retimed/rebuffered data to the other device. The protocol starts with device 1 periodically transmitting low power request messages CL_req to device 2, and device 2 responds by periodically transmitting acknowledgement messages CL_ack. Device 2 may initiate a timer responsive to receiving the CL_req message and may shut down its transmitter after sending a certain number of CL_ack messages to device 1. Device 1 receives the CL_ack messages and may shut down its own receiver and begin transmitting CL_off messages for a predetermined period of time letting device 2 know that it will shut down its own transmitter and thus device 2 can shut down its receiver. In this particular case, both directions of data flow are entering low-power, however it should be noted that in many scenarios one direction of high-speed data flow may remain open.

As the retimer in between them has maintained synchronization within its own local descrambler 240, the retimer can accurately identify these SOS messages being conveyed between device 1 and 2. As such, the controller 280 in retimer 200 may configure its own Rx and Tx elements in either direction to enter low-power modes of operation to save power within the chip.

While the above example is given for a low-power initiation handshake protocol, it should be noted that the controller 280 may be configured to take various other actions via identification of SOS messages identified using descrambler 240 and SOS pattern compare circuit 250.

A high-level process description for one embodiment performing such parsing is:

```
For super-symbol[ 1 ... 12]
    for sizeof(super-symbol)
        compare received data to un_pattern
            if comparison match, increment umatch counter
        if umatch > compare_threshold
            Flag super-symbol as unscrambled ordered set candidate
        else
            descramble data
            for sizeof(super-symbol)
                compare descrambled data to s_pattern
                if comparison match, increment smatch counter
            if smatch > compare_threshold
                Flag super-symbol as scrambled ordered set candidate
    end-for
end-for
(optional: compare Flagged comparison matches with sync flags)
(optional: verify checksum)
(optional: modify Flagged comparisons based on sync flags, checksum.)
```

(optional: modify scrambler state based on checksum, sync flags, Flagged comparison matches.)
Process Flagged super-symbols.

Figure 3:
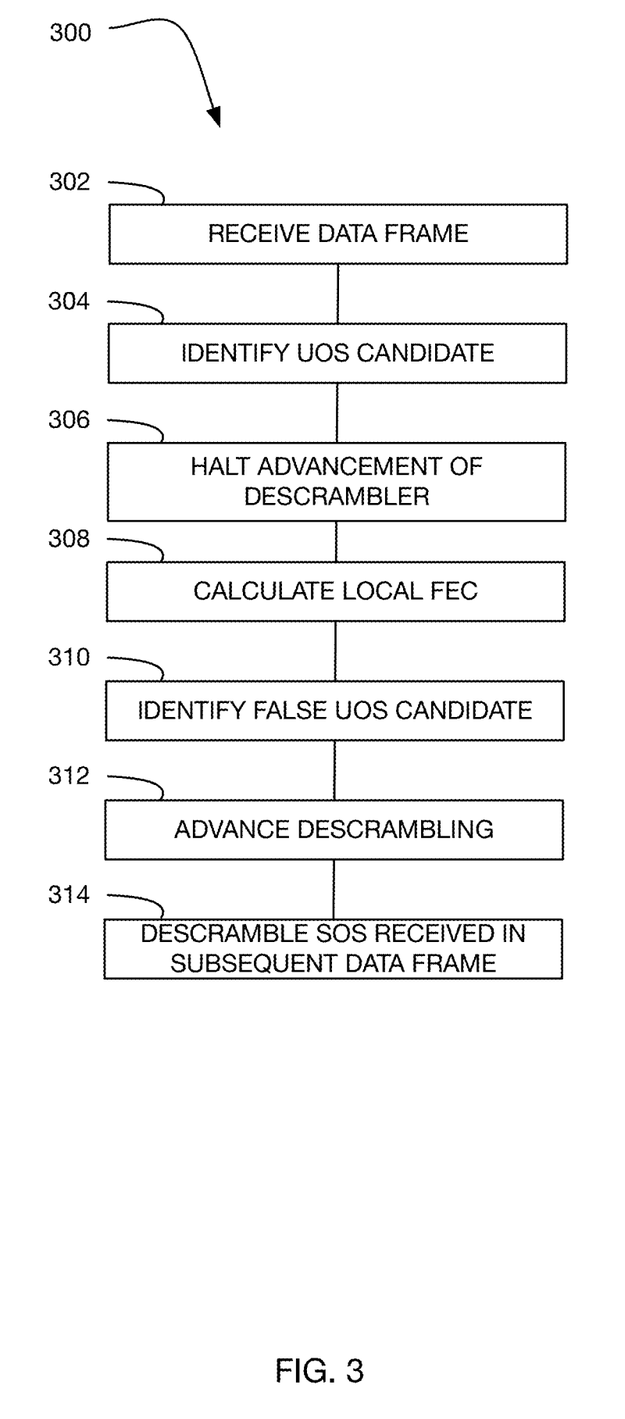
FIG. 3 is a flow chart describing a process in accordance with an embodiment.

FIG. 3 is a flowchart of a method 300, in accordance with some embodiments. As shown, method 300 includes receiving 302 a data frame including a set of super symbols, a set of sync bits and a received forward error correction (FEC) parity word. Method 300 further includes identifying 304 an unscrambled ordered set (UOS) candidate in the set of super symbols by comparing portions of each super symbol to corresponding portions of one or more known UOS values, and responsive to the identification of the UOS candidate, halting 306 advancement of a descrambler operation during the identified UOS candidate. A local FEC parity word is calculated 308 based on the received frame. The UOS candidate is validated against a corresponding sync bit responsive to a comparison of the local FEC parity word to the received FEC parity word to identify 310 a false UOS candidate by validating the UOS candidate against a corresponding sync bit responsive to a comparison of the local FEC parity word to the received FEC parity word. As the UOS candidate is validated as a false UOS candidate, the descrambling operation is responsively advanced 312 to resynchronize the descrambler. In a subsequent data frame (e.g., one absent of any UOS), scrambled super symbols are descrambled 314 to identify scrambled ordered sets.

In some embodiments, identifying the UOS candidate includes performing a byte-wise comparison using e.g., pattern compare circuit 220, of bytes in each super symbol of the set of super symbols to corresponding bytes in the one or more known UOS values 230. In some such embodiments, identifying the UOS candidate includes determining that a predetermined number of bytes in a given super symbol are exact matches to the corresponding bytes in a known UOS value. In some embodiments, each super symbol includes 8 bytes, and the pattern compare circuit 220 determines that at least 6 bytes of the given super symbol are matches to the corresponding bytes in the known UOS value 230 to identify the UOS candidate. Alternatively, each super symbol may include 16 bytes, and the pattern compare circuit 220 may determine that at least 14 bytes of the given super symbol are matches to the corresponding bytes in the known UOS value 230 to identify the UOS candidate.

In some embodiments, at least one scrambled super symbol in the subsequent data frame corresponds to a low-power mode initiation command.

In some embodiments, the method 300 includes identifying a second UOS candidate in a set of super symbols of a second received data frame by comparing portions of each super symbol in the second received data frame to corresponding portions of the one or more known UOS values and halting advancement of the descrambling operation for the second UOS candidate responsive to the identification of the second UOS candidate.

In some embodiments, the method includes calculating a second local FEC parity word based on the second received data frame and comparing the second local FEC parity word to a second received FEC parity word.

In some embodiments, the second UOS candidate may be determined to be a true UOS, and thus no advancement of the descrambling operation is required. Two examples of determining the second UOS is a true UOS are described below. In a first embodiment, the second UOS candidate is verified against a corresponding sync bit received in the second received data frame responsive to determining no errors are present according to a comparison of the second local FEC parity word to a second received FEC parity word. In a second embodiment, the second UOS candidate is determined to be a true UOS by determining a bit error is present according to a comparison of the second local FEC parity word to a second received FEC parity word.

In some embodiments similar to those described above, the method 300 may further include determining that the second UOS candidate is another false UOS candidate by determining no errors are present according to a comparison of the second local FEC parity word to a second received FEC parity word, and validating the second UOS candidate against a corresponding sync bit in the second received data frame. Such embodiments may similarly advance the descrambling operation responsive to determining the second UOS candidate is a false UOS candidate to maintain descrambler synchronization.

In some embodiments, a method parses incoming data to identify a message as it is being received. As the USB 4 message FEC can correct up to two independent byte errors per frame, as many as two comparisons each of size (match segment) may fail to match out of the total number of matches per message segment sizeof(message segment)/sizeof(match segment)

while still identifying that particular received message with high probability.

Various embodiments in accordance with the invention may utilize different criteria as to how accurate a pattern match is acceptable (e.g. how many elements of super-symbol must match a pattern) whether identified matches must be confirmed by association with a properly set sync flag, and under what conditions a FEC parity check error may be ignored. Similarly, different embodiments may choose to pattern match one instance of a 64 bit UOS control message (thus treating actual 128 bit UOS super symbols as two back-to-back control messages) or may pattern match the entire 128 bit sequence consisting of two repeats of the same 64 bit message (with substantially lower risk of false positive identification.) Within the scope of the described embodiments, these criteria may be chosen based on expected correctable and uncorrectable error rates, statistical estimates of match success and match failure, implementation complexity, cost, and power consumption, and the relative benefits and risks of positive or negative match failure rates in identification of particular messages for that particular system and instance.

What is claimed is:
1. A method comprising:
   receiving, at a retimer device, a bit stream of serial data on a first serial data link and retransmitting the bit stream to a receiver over a second serial data link;
   in parallel to the retransmission of the bit stream, descrambling, at the retimer device using a descrambler, super symbols in a set of super symbols corresponding to scrambled ordered sets (SOS) and comparing the descrambled SOS to known SOS values associated with protocol commands;

halting the descrambler responsive to identifying, within a given super symbol of the set of super symbols, a pattern associated with a portion of an unscrambled ordered set (UOS); and advancing the descrambler responsive to determining the identified pattern in the given super symbol is not associated with a received UOS.

2. The method of claim 1, wherein determining the identified pattern in the given super symbol is not associated with a received UOS comprises:

incrementally calculating, within the retimer device, a local forward error correction (FEC) parity word for a data frame comprising the set of super symbols, the data frame further comprising a transmitted FEC parity word and a set of sync bits; and determining the local FEC parity word is equal to the transmitted FEC parity word; and determining the given super symbol is not associated with the received UOS based on a corresponding sync bit in the set of sync bits.

3. The method of claim 1, further comprising identifying a descrambled SOS associated with a low-power mode of operation, and responsively setting the retimer device in the low-power mode of operation.

4. The method of claim 3, wherein setting the retimer device in the low power mode of operation comprises powering down a circuit element selected from the group consisting of: a transmit driver, a phase-lock loop, and a clock-data recovery circuit.

5. The method of claim 3, further comprising identifying a low-frequency power-up signal and responsively setting the retimer device in a high-speed data mode of operation.

6. The method of claim 1, wherein each super symbol comprises eight bytes of data, and wherein identifying the pattern associated with the portion of the UOS comprises determining at least six of the eight bytes of data of the given super symbol match the UOS.

7. The method of claim 1, wherein each super symbol comprises 16 bytes of data, and wherein identifying the pattern associated with the portion of the UOS comprises determining at least 14 of the 16 bytes of data of the given super symbol match the UOS.

8. The method of claim 1, wherein the bit stream is buffered in the retimer device.

9. The method of claim 8, wherein the bit stream is buffered for a duration of one byte.

10. The method of claim 8, wherein the bit stream is buffered for a duration of one super symbol.

11. An apparatus comprising:

a retimer device configured to receive a bit stream of serial data on a first serial data link and to retransmit the bit stream to a receiver over a second serial data link;

a descrambler configured to descramble, in parallel to the retransmission of the bit stream in the retimer device, super symbols in a set of super symbols corresponding to scrambled ordered sets (SOS);

pattern detection logic configured to compare the descrambled SOS to known SOS values associated with protocol commands, and to identify, within a given super symbol of the set of super symbols, a pattern associated with a portion of an unscrambled ordered set (UOS); and a controller configured to halt the descrambler responsive to the identified pattern int the given super symbol, and to advance the descrambler responsive to a determination the identified pattern in the given super symbol is not associated with a received UOS.

12. The apparatus of claim 11, further comprising a forward error correction (FEC) check circuit configured to: incrementally calculate a local FEC parity word for a data frame comprising the set of super symbols, the data frame further comprising a transmitted FEC parity word and a set of sync bits; and the controller is further configured to determine the local FEC parity word is equal to the transmitted FEC parity word and to determine the given super symbol is not associated with the received UOS based on a corresponding sync bit in the set of sync bits.

13. The apparatus of claim 11, wherein the pattern detection logic is configured to identify a descrambled SOS associated with a low-power mode of operation, and wherein the controller is further configured to set the retimer device in the low-power mode of operation.

14. The apparatus of claim 13, wherein the controller is configured to set the retimer device in the low power mode of operation by powering down a circuit element selected from the group consisting of: a transmit driver, a phase-lock loop, and a clock-data recovery circuit.

15. The apparatus of claim 13, further comprising an analog filter configured to identify a low-frequency power-up signal, and wherein the controller is configured to responsively set the retimer device in a high-speed data mode of operation.

16. The apparatus of claim 11, wherein each super symbol comprises eight bytes of data, and wherein the pattern detection logic is configured to identify the pattern associated with the portion of the UOS by determining at least six of the eight bytes of data of the given super symbol match the UOS.

17. The apparatus of claim 11, wherein each super symbol comprises 16 bytes of data, and wherein the pattern detection logic is configured to identify the pattern associated with the portion of the UOS by determining at least 14 of the 16 bytes of data of the given super symbol match the UOS.

18. The apparatus of claim 11, wherein retimer device comprises a buffer configured to buffer the bit stream prior to retransmitting the bit stream to the receiver.

19. The apparatus of claim 18, wherein the buffer has a length of one byte.

20. The apparatus of claim 18, wherein the has a length of one super symbol.

* * * * *